(12) United States Patent
Salzillo et al.

(10) Patent No.: US 8,143,091 B2
(45) Date of Patent: Mar. 27, 2012

(54) METHOD FOR REALIZING A THIN FILM ORGANIC ELECTRONIC DEVICE AND CORRESPONDING DEVICE

(75) Inventors: Giovanna Salzillo, Teverola (IT); Maria Grazia Maglione, Torre del Greco (IT); Anna Morra, Cercola (IT); Luigi Occhipinti, Ragusa (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 79 days.

(21) Appl. No.: 12/625,202

(22) Filed: Nov. 24, 2009

(65) Prior Publication Data
US 2010/0127250 A1 May 27, 2010

(30) Foreign Application Priority Data
Nov. 27, 2008 (IT) .............................. MI2008A2110

(51) Int. Cl.
*H01L 51/40* (2006.01)
(52) U.S. Cl. ................... 438/99; 438/781; 257/E51.005
(58) Field of Classification Search ........... 257/E51.005, 257/E51.006, E51.007
See application file for complete search history.

(56) References Cited

U.S. PATENT DOCUMENTS
5,620,800 A 4/1997 De Leeuw et al.
2002/0151117 A1* 10/2002 Mutsaers et al. ............. 438/149

OTHER PUBLICATIONS
Drury et al., "Low-cost all-polymer integrated circuits", Applied Physcis Letters, vol. 73, No. 1, pp. 108-110, Jul. 6, 1998.*
Makela et al., "Imprinted electrically conductive polyaniline blends," Synthetic Metals 121:1309-1310, 2001.
Occhipinti, L., "Towards a Technology Platform for Organic Electronics," Printed Electronics Conference, San Francisco, CA, Nov. 13, 2007.
Anand et al., "Conducting Polyaniline Blends and Composites," Prog. Polym. Sci. vol. 23:993-1018, 1998.
Beh et al., "Formation of Patterned Microstructures of Conducting Polymers by Soft Lithography, and Applications in Microelectronic Device Fabrication," Adv. Mater. 11(12):1038-1041, 1999.
Cao et al., "Solution-cast films of polyaniline: Optical-quality transparent electrodes," Appl. Phys. Lett. 60 (22):2711-2713, Jun. 1, 1992.
Drury et al., "Low-cost all-polymer integrated circuits," Appl. Phys. Lett. 73(1):108-110, Jul. 6, 1998.

(Continued)

*Primary Examiner* — Michael Lebentritt
*Assistant Examiner* — Daniel Whalen
(74) *Attorney, Agent, or Firm* — Seed IP Law Group PLLC

(57) ABSTRACT

A method realizes a thin film organic electronic device integrated on a substrate and includes an organic material layer and an organic thin film transistor or OTFT transistor. The method comprises: depositing the organic material layer on the substrate, the organic material layer being a conductive organic polymer; patterning by a soft-lithographic procedure the organic material layer to create a reduced portion in order to make a channel area of the OTFT transistor; masking the organic material layer by covering with a cover mask a source area and a drain area of the OTFT transistor; irradiating by ultraviolet radiation to deactivate exposed portions of the organic material layer defining the source area, the drain area and the channel area; depositing on the organic material layer a semiconductor layer; and creating on the semiconductor layer a gate area of the OTFT transistor.

26 Claims, 13 Drawing Sheets

OTHER PUBLICATIONS

Gelinck et al., "Flexible active-matrix displays and shift registers based on solution-processed organic transistors," Nature Materials vol. 3:106-110, Feb. 2004.

Gustafsson et al., "Flexible light-emitting diodes made from soluble conducting polymers," Nature vol. 357:477-479, Jun. 11, 1992.

Heeger, A., "Semiconducting and metallic polymers: the fourth generation of polymeric materials," Synthetic Metals vol. 125:23-42, 2002.

Karg et al., "Increased brightness and lifetime of polymer light-emitting diodes with polyaniline anodes," Synthetic Metals vol. 80:111-117, 1996.

Kymissis et al., "Patterning pentacene organic thin film transistors," J. Vac. Sci. Technol. 20(3):956-959, May/Jun. 2002.

Nuzzo, R., "The future of electronics manufacturing is revealed in the fine print," PNAS 98(9):4827-4829, Apr. 24, 2001.

Pereira et al., "Secondary doping of polyaniline studied by resonance Raman spectroscopy," Electrochimica Acta vol. 44:1887-1891, 1999.

Vacca et al., "PANI-CSA: An Easy Method to Avoid ITO Photolithography in PLED Manufacturing," Macromol. Symp. vol. 228:263-272, 2005.

Xia et al., "Soft Lithography," Angew. Chem. Int. Ed. vol. 37:550-575, 1998.

Yang et al., "Enhanced performance of polymer light-emitting diodes using high-surface area polyaniline network electrodes," J. Appl. Phys. 77(2):694-698, Jan. 15, 1995.

Yang et al., "Polyaniline as a transparent electrode for polymer light-emitting diodes: Lower operating voltage and higher efficiency," Appl. Phys. Lett 64(10):1245-1247, Mar. 7, 1994.

Bao et al., "Organic Semiconductors for Plastic Electronics," Bell Laboratories, Lucent Technologies, 2001.

* cited by examiner

| Al (cathode) | Alq₃ (ETL) | PVK (HIL) | ITO (anode) | Glass (substrate) |

FIG. 5
*(Prior Art)*

| Al (cathode) | Alq₃ (ETL) | PVK (HTL) | PANI/CSA (HIL) | ITO (anode) | Glass (substrate) |

FIG. 6
*(Prior Art)*

| Al (cathode) | Alq₃ (ETL) | TPD (HTL) | PANI/CSA (HIL) | ITO (anode) | Glass (substrate) |

FIG. 7
*(Prior Art)*

| | Device | Barrier (eV) | Barrier reduction |
|---|---|---|---|
| 1 | ITO/PVK/Alq3/Al (no PANI) | 0.9 | / |
| 2 | ITO/PANI-CSA/PVK/Alq3/Al | 0.5 | 44% |
| 3 | ITO/PANI-CSA/TPD/Alq3/Al | 0.3 | 40% with respect to the device 2<br>67% with respect to the device 1 |

METHOD FOR REALIZING A THIN FILM ORGANIC ELECTRONIC DEVICE AND CORRESPONDING DEVICE

BACKGROUND

1. Technical Field

The present disclosure relates to a method for realizing a thin film organic electronic device integrated on a substrate comprising an organic material layer and at least an organic thin film transistor or OTFT transistor. The disclosure also relates to a thin film organic electronic device.

2. Description of the Related Art

As it is well known, in the last decade great interest has been shown in the field of the microelectronics, for organic electronic devices which use, alternatively with respect to some frequently used materials, organic material layers and in particular organic polymers.

Some examples of known devices are organic LEDs or OLEDs and OTFT transistors (Organic Thin Film Transistors).

The organic polymers allow to combine the high conductivity, normally property of the metals, with the mechanical properties of the organic materials, such as the flexibility and the possibility of being manufactured as thin films.

Moreover, organic electronic devices are, in general, cheaper than the traditional ones and show a high reliability and efficiency.

A particular interest has been also turned to the so called conjugate organic polymers which, from the electronic viewpoint, behave as insulators or semiconductors but which advantageously change the conductivity degree drastically according to the oxidation status.

For example, a conjugate organic polymer is subjected to a "doping" process step for increasing the conductivity by several orders of magnitude. The "doping" step or protonation step generally consists in a reaction of the conjugate polymer with a doping agent, oxidizing or reducing or a protonic acid, whereby a high polycationic or polyanionic delocalization is obtained.

A conjugate organic polymer, insulating or semiconductive, with a conductivity typically from $10^{-10}$ to $10^{-5}$ S*cm$^{-1}$ subjected to the protonation step can increase the conductivity up to $1*10^4$ S*cm$^{-1}$. The polymer conductivity can be controlled by the nature of the doping agent, by the doping level and by the blending with other conventional polymers such as for example the insulators which allow to optimize the properties of the polymer obtained.

However, the main part of the conjugate organic polymers have a high ionization potential, about 5 eV, and thus use contact terminals with low ohmic contact, for example of the metallic type, to reach high performances of the organic devices obtained.

Metals suitable for this function are the noble metals, such as gold or platinum, which are however excessively expensive.

Alternatively, the prior art proposes the use of an interposed material which acts as interface between the metallic layers of a device, for example in the case of an OLED i.e., a LED of the organic type, between the anode and the cathode.

Efficient improvements have been obtained by using the polyaniline as interposed material, as reported in the articles by P. Vacca, M. G. Maglione, C. Minarini, G. Salzillo, E. Amendola, D. Della Sala, A. Rubino, entitled: "PANI-CSA: An Easy Method to Avoid ITO Photolithography in PLED Manufacturing", Macromolecular Symposia; and by Y. Cao, G. M. Treacy, P. Smith, A. J. Heeger, entitled: "Solution-Cast Films of Polyaniline: Optical-Quality Transparent Electrodes", *Appl. Phys. Lett.* (1992), Vol. 60, Pg. 2711; as well as in the document App. Phys. Lett. Vol. 73, pages 108-110; and in the U.S. Pat. No. 5,620,800 to Philips Corporation.

Particular interest has been turned also to the polyaniline doped and complexed with the camphorsulphonic acid, also known with the acronym PANI-CSA. In particular, it is known that the polyaniline PANI/CSA has a conductivity that can be modified by means of photolithographic techniques. According to a known process, described in Progr. Polym. Sci, Vol. 23, pages 993-1018 and schematically indicated in FIG. 1, by starting from a base of emeraldine, as semiconductor material, and by adding camphorsulphonic acid, as primary dopant (protonation), in an m-cresol solvent, as secondary dopant, and by treating the mixture obtained in an ultrasonic bath for forty-eight hours at the temperature of 50° C., an emeraldine salt is obtained, i.e., a metal.

The conductive mixture obtained can be deposited as layer on a glass or plastic substrate, as shown in FIGS. 2 and 3, by means of an etching with ultraviolet radiations, for example with a wavelength equal to λ=250 nm, and by using a suitable mask, an alternation can be obtained of conductive areas, i.e., non-irradiated portions covered by the mask, with insulating areas, i.e., irradiated portions which, from emeraldine salt become leucomeraldine. This process is also described in App. Phys. Lett. Vol. 73, pages 108-110 ed.

Even more in particular, the irradiated portions that have become insulating undergo an expansion which substantially results in an increase of thickness, as shown in FIG. 3.

For an emeraldine salt layer with a thickness for example equal to 0.3 μm the resistivity of the conductive portions is equal to $10^4$ Ω/m² while the resistivity of the non-conductive portions is equal to $10^{10}$ Ω/m².

It is known that suitable polyaniline layers deposited on glass or plastic substrates behave as an anode for organic LEDs or OLEDs, as described in the article by G. Gustafsson, Y. Cao, G. M. Treacy, F. Klavetter, N. Colaneri, A. J. Heeger, entitled: "Flexible Light-Emitting Diodes Made From Soluble Conducting Polymer", *Nature* (1992), Vol. 357, Pg. 477, and also in the articles by Y. Yang, E. Westerweele, C. Zhang, P. Smith and A. J. Heeger, entitled: "Enhanced Performance of Polymer Light-Emitting Diodes Using High-Surface Area Polyaniline Network Electrodes", *J. Appl. Phys.* (1995), Vol. 77, Pg. 694; and by Y. Yang, and A. J. Heeger, entitled: "Polyaniline as a Transparent Electrode for Polymer Light-Emitting Diodes: Lower Operating Voltage and Higher Efficiency", *Appl. Phys. Lett.* (1994), Vol. 64, Pg. 1245.

Some schematic examples of organic LEDs or OLEDs, realized by the Applicant, are schematically shown in FIGS. 5, 6 and 7.

In particular, in the example of FIG. 5, the LED shows a multilayer structure which comprises a thin oxide layer of indium, also known with the acronym of ITO (Indium Tin Oxide), realized on a substrate, in particular of glass; on the ITO layer a thin film of poly(N-vinylcarbazole) or PVK, a layer of Alq3 (Tris (8-hydroxy) quinoline aluminum)—serving as electrons carrier layer and also indicated as ETL (acronym from the English: "Electron Transport Layer")—and an upper aluminium layer are realized in sequence. The substrate realizes the anode of the LED thus obtained, while the aluminium layer realizes its cathode.

In the example of FIG. 6, the multilayer structure suitable for realizing the organic LED differs from the example of FIG. 5 due to the presence of a polyaniline layer PANI/CSA interposed between the layer ITO and the layer PVK.

Further, in the example of FIG. 7, the multilayer structure is substantially similar to the structure of FIG. 6 where the layer of PVK is replaced by a layer of N,N'-diphenyl-N,N'-bis(3-methylphenyl)-[1,1'-biphenyl]-4,4'-diamine or TPD.

The interposition of the polyaniline layer PANI/CSA allows, advantageously, to lower the voltage barrier between the anode and the cathode of the OLED with an overall improvement of the technical features as shown in the diagrams of FIGS. 8 and 9, referred to the OLED realized according to FIG. 6, which show a substantial improvement in the charge transport which allows to reduce the turn-on or barrier voltage, as further indicated in the comparative table of FIG. 10 with reference to the example of FIGS. 5-7.

This table shows, in particular, that from a barrier voltage of 0.9 eV of the OLED of FIG. 5 a voltage equal to 0.3 eV of the OLED of FIG. 7 is reached.

It is to be underlined that the combination between the high conductivity of the polyaniline with the low surface resistance of the layer of ITO is responsible for the effective improvement of an electrode realized with a double layer PANI/ITO, as shown in FIGS. 6 and 7 with respect to one realized with a single layer of ITO, as shown in FIG. 5 or similarly, if a single polyaniline layer were used.

Further, it is to be underlined that the polyaniline layer operates as a "buffer" layer between the ITO layer and the overhanging conjugate polymer, realized by the layer PVK or by the layer TPD, allowing, even more in particular, to control the release of oxygen from the ITO layer caused by the oxidation of the conjugate polymer.

In fact, it is known that the oxygen released from the ITO layer determines a degradation mechanism of the overhanging activated conjugate polymer layer, as also described in the article by S. Karg, J. C. Scott, J. R. Salem, M. Angelopoulos, entitled: "Increased Brightness and Lifetime of Polymer Light-Emitting Diodes With Polyaniline Anodes", *Synthetic Metals* (1996), Vol. 80, Pg. 111.

An organic electronic device, realized by the Applicant according to the principles of the prior art, is schematically shown in FIG. 12, globally indicated with 1.

In particular, the device 1 is integrated on a substrate 10, of glass or of plastic material, and in the embodiment shown it comprises an organic thin film transistor OTFT (organic thin film transistor), indicated with 90, as well as a circuitry section 95, wherein at least one contact area PAD is realized for the external connection by means of contact electrodes with supply voltage references and/or data transfer circuits.

The OTFT transistor 90 is in a top-gate/bottom-contact arrangement and comprises source 16 and drain 17 contact areas.

The source 16 and drain 17 contact areas and the contact area PAD are suitably realized from a first conductive organic material layer 5 deposited on a substrate 10.

The device 1 also comprises a second filling dielectric layer 11 realized on the substrate 10.

Above the source 16 and drain 17 contact areas and in contact with them, the device 1 comprises a third semiconductor organic material layer 12 used to improve the electric qualities of the organic transistor OTFT 90.

A fourth dielectric material layer 13 completely covers the substrate 10 leaving the contact area PAD 95 exposed.

Above the source 16 and drain 17 contact areas a fifth conductive organic material layer 14 is further present suitable for realizing a gate contact area for the transistor OTFT 90.

A sixth encapsulation layer 15 completely covers the substrate 10 leaving only the contact are PAD exposed for the external connection with the device 1 obtained.

A known method for realizing the device 1 is hereafter described with reference to FIGS. 13 to 24. This method has also been shown during the conference "Printed Electronics Conference" in San Francisco on Nov. 13th-14th, 2007 (by Mr. L. Occhipinti).

The method comprises the steps of:
depositing on the substrate 10 of glass or of plastic material, with spin coating procedure the first conductive organic material layer 5;
patterning this first layer 5 by means of an etching with reactive ions or RIE (Reactive Ion Etching) to obtain a contact area PAD/Vias for external connections and source 16 and drain 17 contact areas for the transistor OTFT 90, as indicated in FIG. 13.

The method then provides the steps of:
depositing on the substrate 10 a second filling dielectric layer 11. Advantageously, the second dielectric layer 11 is of the organic type with low dielectric DIE1 and covers the source 16 and drain 17 areas as indicated in FIG. 14;
patterning by soft-lithographic or imprinting procedure the second organic dielectric layer 11 by using a suitable mold Mold1, of the type shown in FIG. 4, used to transfer a predetermined pattern to said second organic dielectric layer 11.

It is known that elastomeric molds thus made mainly have a flat structure with prearranged protuberances having a predefined geometric relation. In particular, L indicating the width of these protuberances and H their thickness, their relation is: $0.2<H/L<2$ Even more in particular, the mold Mold1, in the present embodiment, shows protuberances above the contact area PAD, the source 16 and drain 17 areas, as shown in FIG. 15. The mold Mold1 will be explained further hereafter.

Subsequently, the method provides the steps of:
removing the mold Mold1, as shown in FIG. 16;
etching the second organic dielectric layer 11 to bring to surface the contact area PAD, the source 16 and drain 17 contact areas, as shown in FIG. 17 according to the patterning formed by the mold Mold1.
depositing above the second organic dielectric layer 11, in a selective and localized way, a third organic material layer 12.

The method provides to deposit on the source 16 and drain 17 contact areas, as shown in FIG. 17, a semiconductor organic material 12a OSC1, and to deposit above the contact areas PAD, a conductive organic material 12b of the MTL2 type, as shown in FIG. 18.

Suitably, the deposition of the semiconductor organic material 12a OSC1 occurs by means of inkjet procedure or IJP (InkJet Printing) using an ink jet printer 50 by employing for example P3HT material (Poly (3-Hexylthiophene)) or other material, while the deposition of the conductive organic material MTL2 12b, occurs by means of IJP procedure by employing for example material of the Poly(3,4-ethylenedioxythiophene)-poly(styrenesulfonate) (PEDOT/PSS) type or metal that can be patterned.

The method provides then the steps of:
depositing with spin coating procedure a fourth layer 13 suitable for completely covering the substrate 10 as shown in FIG. 19; preferably the fourth layer 13 has high dielectric constant K;
patterning by means of soft-lithographic or imprinting procedure the fourth layer 13 by using a second mold Mold2 for carrying out suitable and prearranged reductions of thickness of the fourth layer 13 in correspondence with the contact areas PAD, as shown in FIG. 20.

Subsequently, the method provides the step of:
removing the second mold Mold2;
etching the fourth layer 13 to bring to surface the contact area PAD, as shown in FIG. 21;
depositing with spin coating procedure a fifth layer 14 suitable for completely covering the substrate 10, as shown in FIG. 22; preferably the fifth layer 14 is a conductive organic material, for example PEDOT/PSS or a metal that can be patterned;
patterning by means of soft-lithographic or imprinting procedure the fifth layer 14 by using a third mold Mold3, as shown in FIG. 23 to define by means of etching suitable and prearranged gate contact areas for the transistors OTFT.

Subsequently, the method provides the step of:
removing the third mold Mold3;
etching the fifth layer 14 to eliminate the residues of organic material;
depositing an encapsulating layer, not shown in these figures.

Advantageous under several aspects, the organic devices thus obtained however show some drawbacks.

For connecting the organic polymers, contained in the OTFT devices, to supply sources and/or to circuits for the data transfer, contact terminals with low ohmic contact are used. As previously indicated, the ionization potential of the mainly used organic polymers is equal to about 5 eV.

A further drawback of the organic devices thus obtained is linked to the patterning step of the conductive organic layer, as described also in the article by Kymissis, Dimitrakopoulos, Purushothaman, entitled: "Patterning Pentacene Organic Thin Film Transistors", J. Vac. Sci. Technol. B 20, pages 956-959 (2002).

A correct patterning step, in particular in the OTFT transistors obtained, considerably reduces the leakage current and thus increasing the ration $I_{ON}/I_{OFF}$, as described in the article by Gelinck et al., entitled: "Flexible Active-Matrix Displays and Shift Registers Based on Solution-Processed Organic Transistors", Nature Materials 3 pages 106-110 (2004).

Generally, in the process of realization of the organic devices the patterning step occurs by means of "wet" steps which however are not suitable for organic polymers with low molecular weight.

In fact, these organic polymers show a high intermolecular interaction but a weak interaction with the underlying substrate and the exposure of the organic polymer layer to liquid solvents induces a relaxation between the chemical bonds of the molecules which drastically reduces the conductive properties i.e., of charge transport. This occurs also if the organic polymer used is insoluble in the solvent used.

Several solutions have been proposed for the step of patterning the layers or thin films of organic polymers. None of them however is satisfactory for all the applications.

A solution provides to use a mask of the shadow mask type, other solutions proposed provide instead to physically remove the conductive organic polymer not necessary, for example by means of a lithographic step.

These solutions although satisfactory in a research lab show serious difficulties when used in a production in series and are also little suitable for producing the patterning for high areal densities.

Further, some of the known solutions require masks that must be cleaned any time they are used, while the masks with high resolution show the drawback of being very fragile.

To solve these drawbacks it is known to use so called printing methods which combine a deposition step and a patterning step in a single step.

A known solution is described in the article by Z. Bao, A. Dodabalapur, H. Katz, R. V. Raju, J. A. Rogers, entitled: "Organic Semiconductors for Plastic Electronics", Bell Laboratories, Lucent Technologies.

However, the realization of OTFT transistors by means of the printing method strongly depends on the availability of starting materials of high quality and typically formulated according to a specific composition.

The realization by means of the printing method results thus rather complicated and expensive particularly not suitable for the realization of devices on a large scale.

An alternative solution provides the use of conventional photolithographic techniques.

The conventional photolithographic techniques however show some drawbacks, such as the example described in the article by Y. Xia and G. M. Whitesides, entitled: "Soft Lithography", Angew. Chem. Int. Ed. 37, 550-575 (1998).

Moreover, the sizes generated by means of the photolithographic techniques are limited by the optical diffraction and to be easily applied, they require the presence of planar surfaces. In fact, their use on irregular surfaces is particularly complicated and expensive.

Further, the surfaces obtained by means of the patterning step are not chemically controlled, i.e., they could undergo modifications that cannot be foreseen to date.

Moreover, for generating small openings or "features" by means of photolithographic techniques radiations with high energy are required which however need particularly complex plants and technologies.

Alternatively, the use of soft-lithographic techniques is known. The term soft-lithographic indicates a series of steps suitable for realizing microstructures and nanostructures of high quality. Generally, molds of the elastomeric type are used with predefined channels wherein a liquid penetrates through capillarity and transfer the predetermined pattern to an organic material active layer. As indicated in FIG. 11.

BRIEF SUMMARY

One embodiment is a method for realizing a simple and economic electronic device which, alternatively with respect to the prior art, allows to realize a thin film organic electronic device having such structural and functional characteristics in this way to overcoming the limits and/or drawback still affect the devices realized according to the prior art.

One embodiment uses conductive organic polymer layers defined by using soft-lithographic techniques.

One embodiment is a method for realizing a thin film organic electronic device integrated on a substrate and comprising an organic material layer and at least an organic thin film transistor OTFT. The method includes:
depositing the organic material layer on the substrate, this organic material layer being a conductive organic polymer;
patterning, by soft-lithographic procedure, the organic material layer for realizing at least one reduced portion suitable for realizing a channel area of the transistor OTFT;
masking the organic material layer by covering with a covering mask a source area and a drain area of the transistor OTFT;
irradiating by means of ultraviolet radiation UV suitable for deactivating exposed portions of the organic material layer defining the source area, the drain area and the channel area, the channel area having a thickness increase;

depositing on the organic material layer a semiconductor layer;

realizing on the semiconductor layer a gate are of said transistor OTFT.

One embodiment is a thin film organic electronic device integrated on a substrate comprising an organic material layer and including an organic thin film transistor (OTFT). The organic material layer is a conductive organic polymer, and the OTFT includes a source area and a drain area that are portions of the layer of organic material and a channel area is realized in a reduced portion of the organic material layer. The reduced portion is obtained by means of soft-lithographic procedure, the channel area increasing by thickness and being reduced to the insulating form by means of ultraviolet radiation UV.

The characteristics and advantages of the method and of the device according to the disclosure will be apparent from the following description of an embodiment thereof given by way of indicative and non-limiting example with reference to the annexed drawings.

BRIEF DESCRIPTION OF THE SEVERAL VIEWS OF THE DRAWINGS

In these drawings:

FIGS. 5, 6 and 7 schematically show three different combinations of layers for the realization of respective organic Leds according to the prior art;

DETAILED DESCRIPTION

With reference to these figures and in particular to FIGS. 25-32, a method is described for realizing a thin film organic electronic device 100, according to the present disclosure, integrated on a substrate 110, realized with glass or with plastic material.

In the present embodiment, the organic electronic device 100 comprises a transistor OTFT 145 in a top-gate/bottom-contacts arrangement and a contact area PAD suitable for allowing the connection by means of contact electrodes with external supply voltages and/or data transfer circuits.

Figure 26:
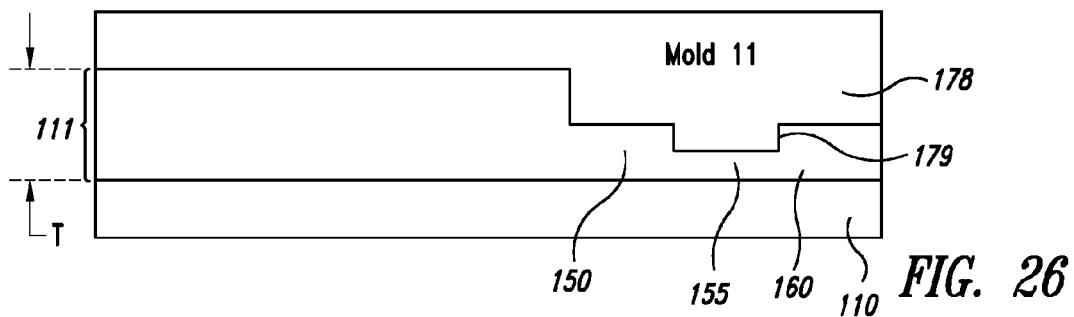
FIGS. 26 to 32 schematically show in sequence the process steps of the method for realizing the device architecture of FIG. 25.

The method comprises a first step of depositing on the substrate 110 a conductive organic material layer 111, as shown in FIG. 26. Preferably, the organic material layer 111 is a conductive conjugate organic polymer with a predefined starting thickness T, which, in the embodiment shown, is of 300 nm.

Even more in particular, the organic material layer 111 is a mixture comprising polyaniline of the doped and complexed type with the camphorsulphonic acid, known with the acronym PANI-CSA. Preferably, according to an embodiment of the present disclosure, the mixture of complexed conductive polyaniline comprises polyaniline in the base form (EB) protonated with camphor sulphonic acid (CSA). This mixture PANI-CSA is preferably of the type at 3.5% w/w and is prepared by using meta-cresol as solvent.

The mixture PANI-CSA obtained has a viscosity of 27.8 mPa*s and is suitably filtered so as to remove possible traces of non-reacted material.

The mixture PANI-CSA has such a consistency as to be deposited on polysilicon substrates or on polymeric or vitreous substrates. Advantageously, the method provides to disperse in the mixture PANI-CSA a photoinitiation at 5% w/w of 1-idroxycicloesilphenilketon, which can be activated by means of ultraviolet (UV) radiation to obtain a conductive/insulating patterning in the organic material layer 111 deposited.

Advantageously, according to the present disclosure, the first depositing step uses a spin-coating procedure for depositing the mixture PANI/CSA which defines the organic material layer 111.

Subsequently, the method provides an annealing step which allows to warm the mixture PANI/CSA of the organic material layer 111, preferably by means of a heating plate at 50° C. for about 4 hours.

Figure 27:
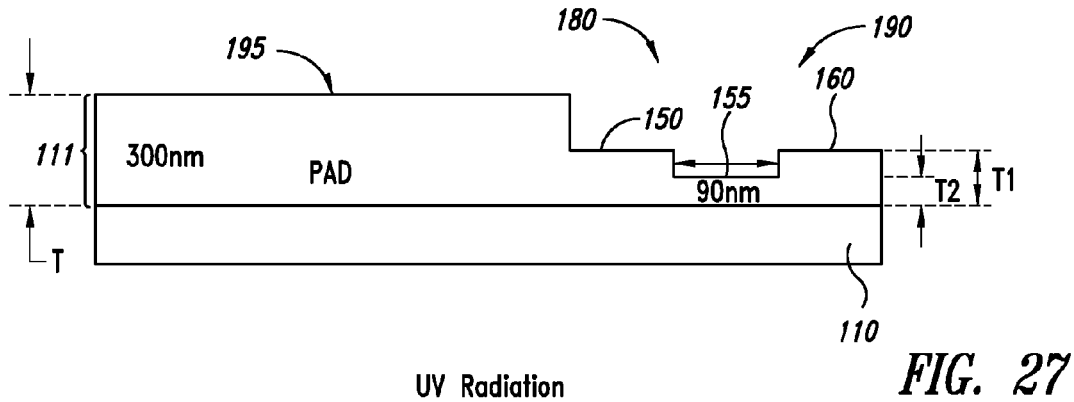

The method then comprises a second step of patterning, by means of a soft-lithographic procedure, the mixture PANI/CSA suitable for realizing at least one reduced portion 180 of said organic material layer 111 and for realizing, in this reduced portion 180, at least one source area 150, one drain area 160 and a suitable channel area 155 of the transistor OTFT 145, as shown in FIG. 27. In particular, with the realization of such reduced portion 180 areas of the conductive organic polymer layer 111 are identified which will define corresponding source and drain areas of the transistor OTFT 145 when the corresponding adjacent areas are made non-conductive.

Figure 1:
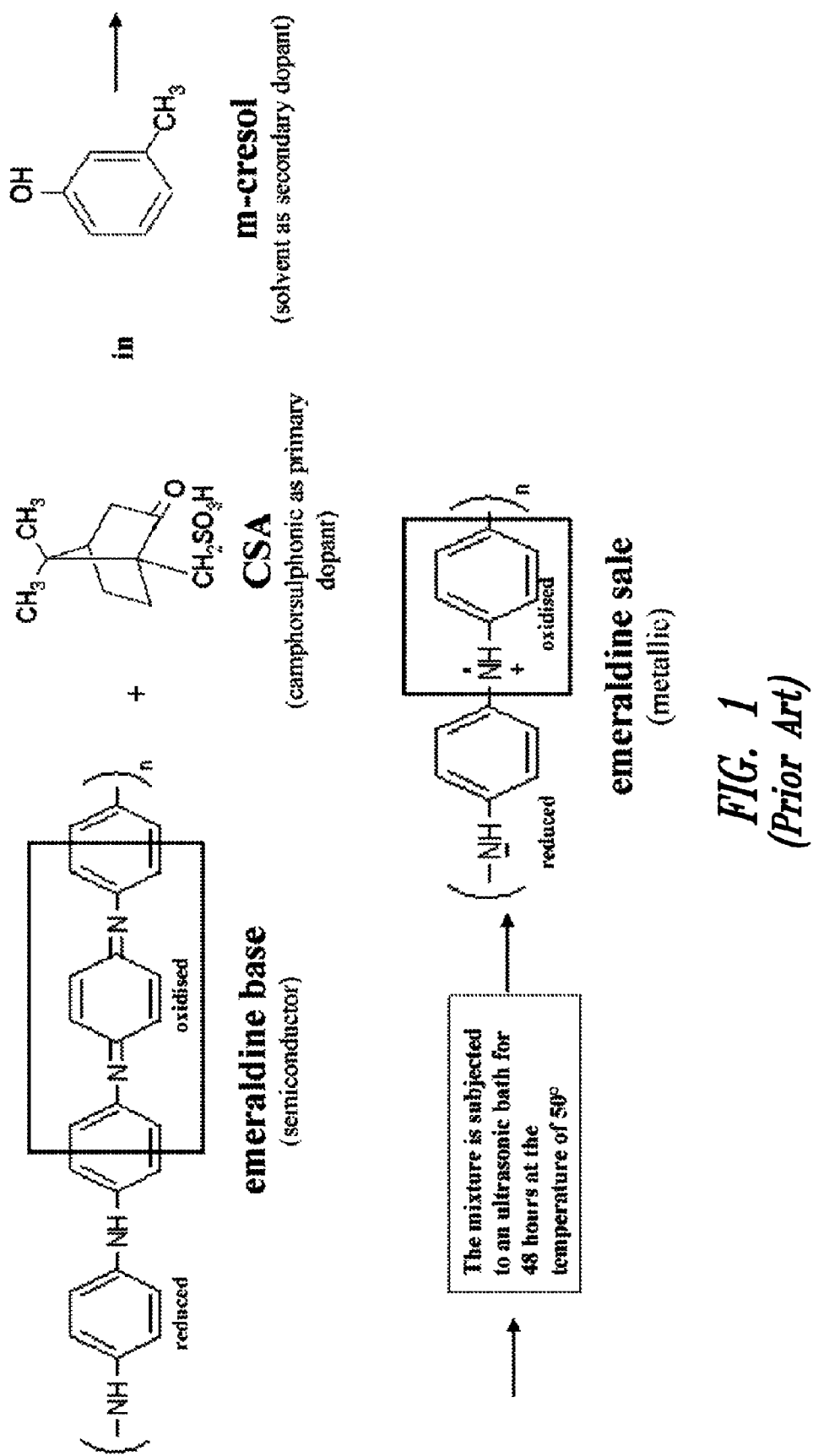
FIG. 1 schematically shows the steps for obtaining polyaniline PANI/CSA starting from an emeraldine base according to the prior art.
Figure 2:
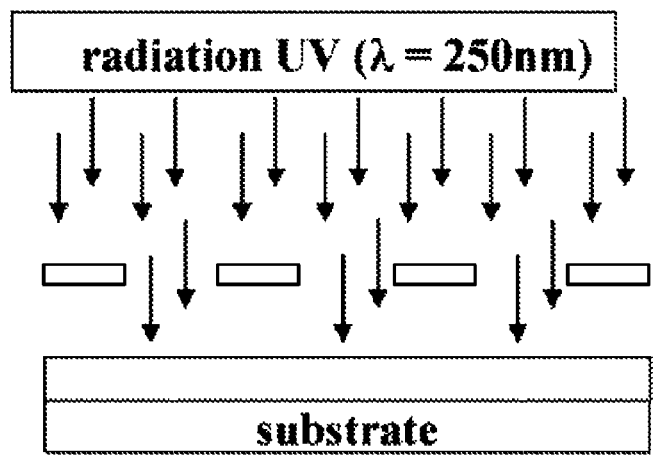
FIGS. 2 and 3 schematically show in sequence two steps of a process for the definition of an alternation of conductive and insulating areas of a layer of conductive organic polymer according to the prior art.
Figure 3:
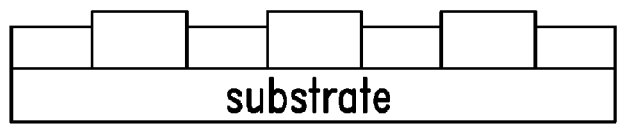
Figure 4:
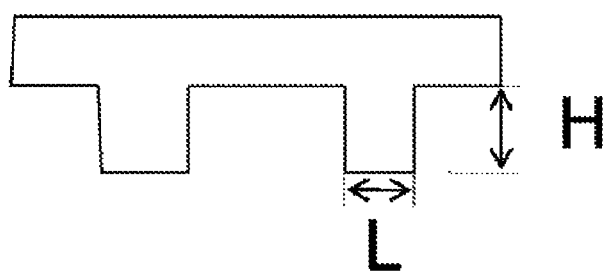
FIG. 4 schematically shows a mold used in soft-lithographic techniques according to the prior art.
Figure 8:
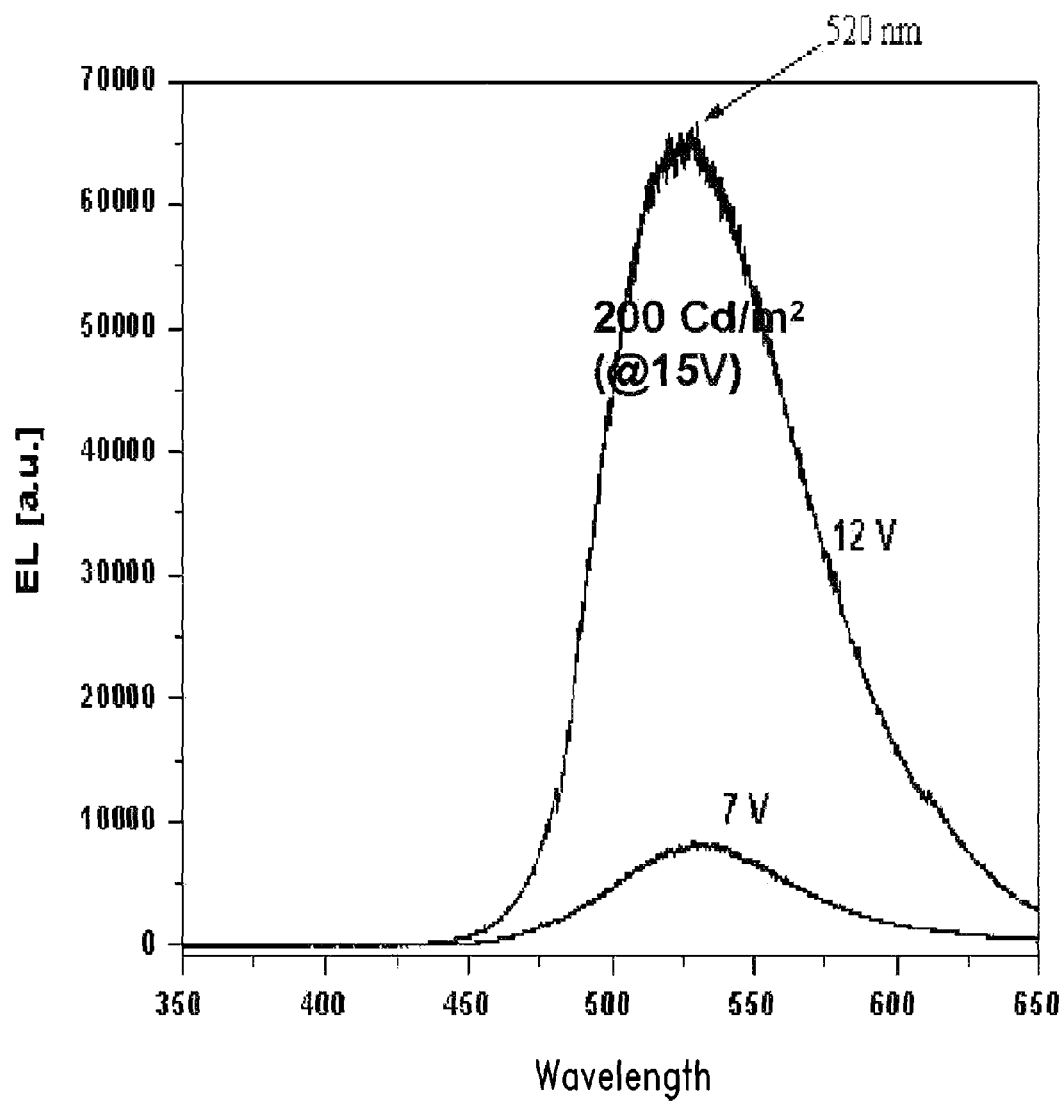
FIGS. 8 and 9 respectively show the characteristics of luminescence and of threshold voltage of an organic Led realized according to the layered structure indicated in FIG. 6.
Figure 9:
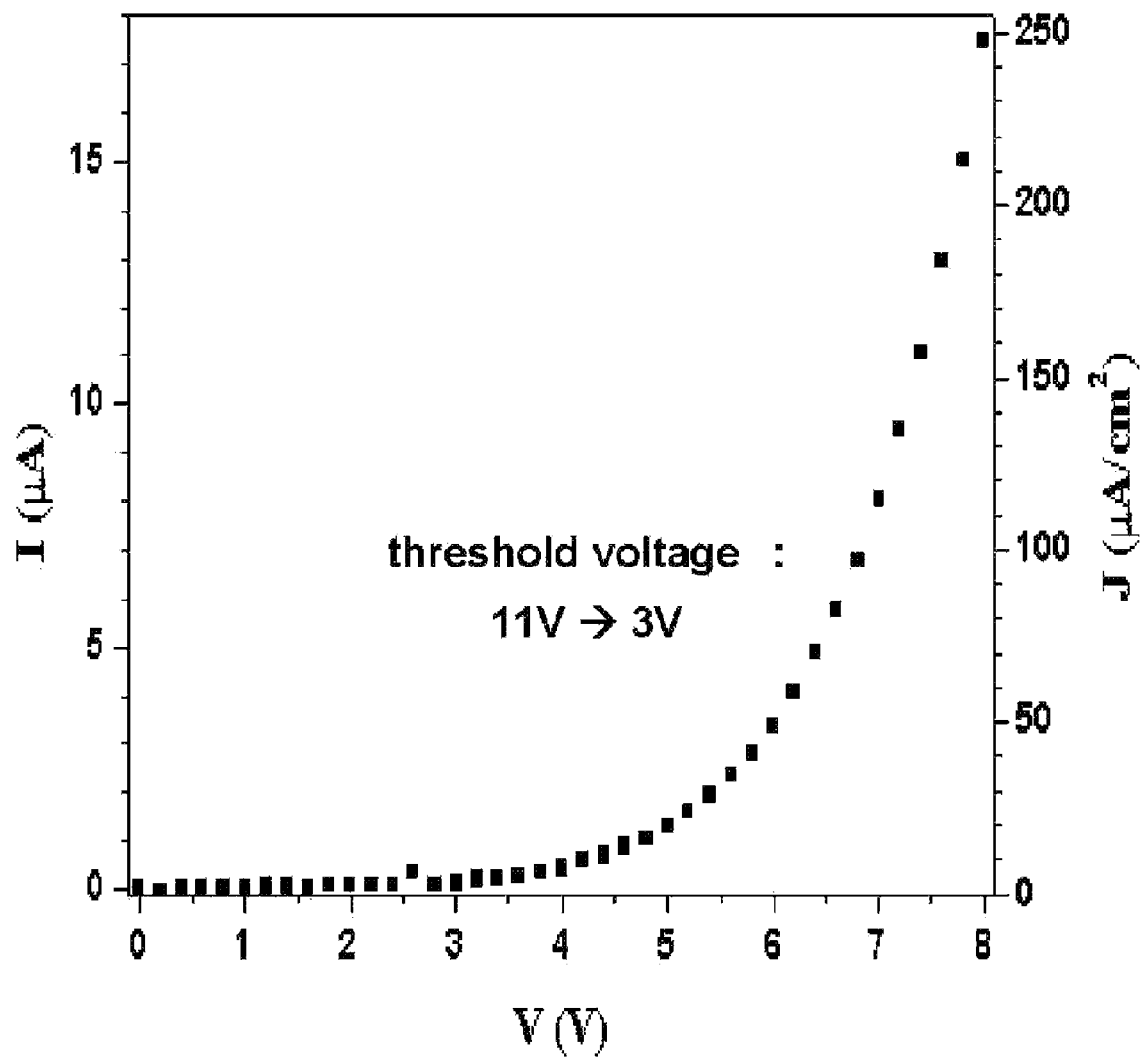
Figures 10, 11:
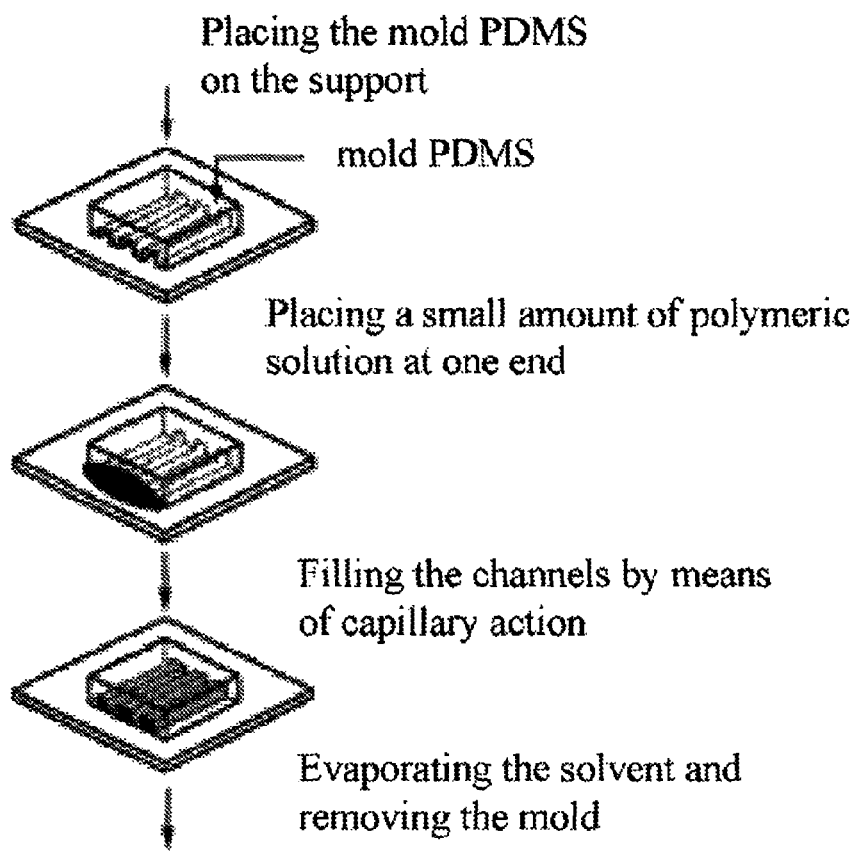
FIG. 10 is a table reporting the barrier voltage of organic Leds realized according to FIGS. 5, 6 and 7.
FIG. 11 schematically shows some steps of a soft-lithographic procedure which uses a mold of the elastomeric type according to the prior art.
Figure 12:
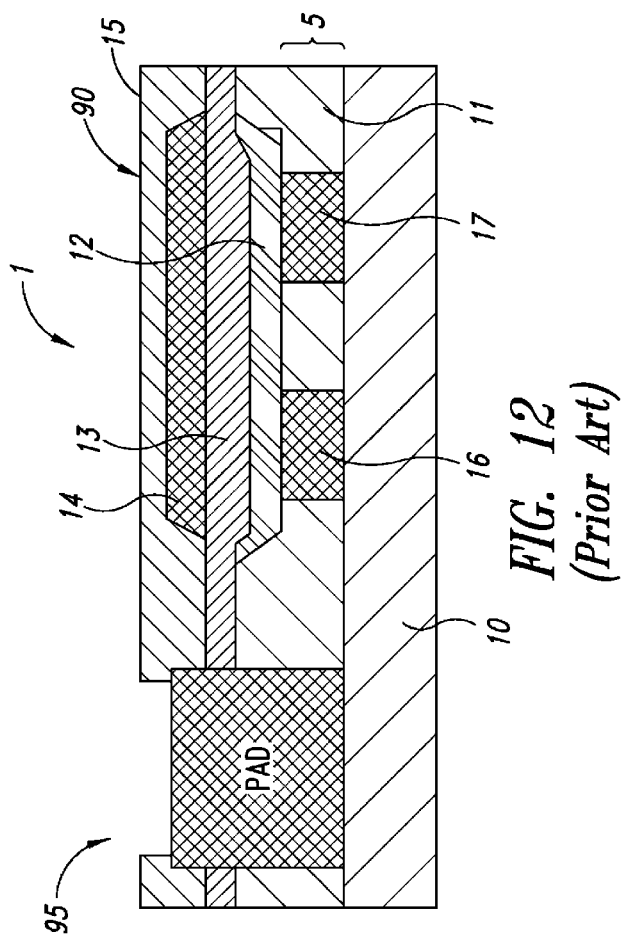
FIG. 12 schematically shows a section of an organic electronic device realized according to the prior art.

In particular, the method provides to use as soft-lithographic procedure of the second step, for example, Nano-imprinting or a nanomold or NIL (acronym: "Nano-imprinting Lithography") lithography procedure which uses a mold Mold11 of the type shown in FIG. 26. It is to be noted that the shape of the mold Mold11 is such as to respect the conditions indicated relatively to the mold Mold1 of FIG. 4. The mold Mold11, preferably elastomeric, is used for patterning organic material layers, per se already known, and has a plate structure with suitable protuberances which have such sizes as to meet the geometric relation: 0.2<H/L<2, in which L is the width of these protuberances and H their thickness.

The mold Mold11 comprises, according to the present embodiment, a first protuberance 178, plate-like shaped, suitable for realizing the source 150 and drain 160 areas and a second protuberance 179, plate-like shaped, centrally projecting from the first protuberance 178, suitable for realizing the channel area 155, as shown in FIG. 26.

In this way, the reduction of thickness of the conductive organic polymer layer 111 will be greater in correspondence with the channel area 155 which has a reduced thickness "T2" if compared with the thickness "T1" of the source area 150 and of the drain area 160 which have, in turn, thickness lower than "T". Thanks to this, the conductive organic polymer layer 111 has reduced thickness in correspondence with the lowered portion 180 allowing to advantageously reduce the total thickness of the thin film transistor OTFT 145 which is obtained.

Figure 28:
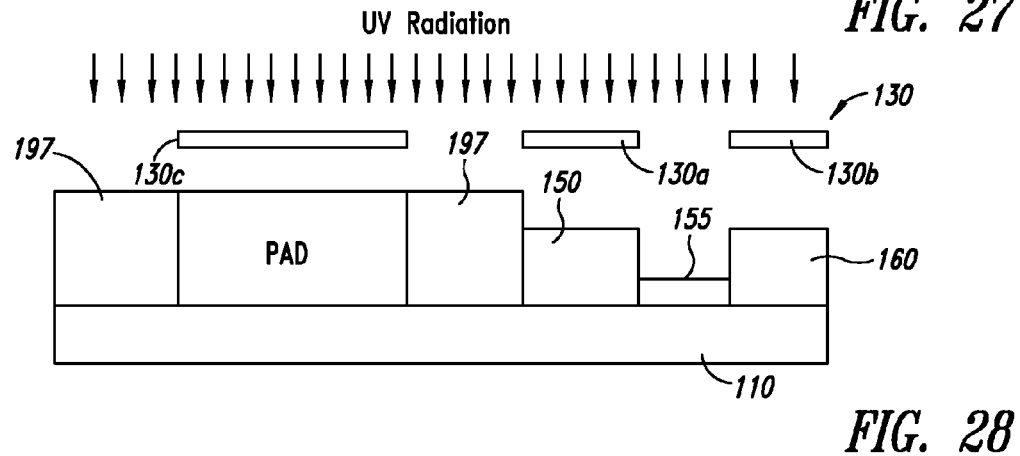

The method according to the disclosure then comprises a third step of masking the conductive organic polymer layer 111 in correspondence with the source 150 and drain 160 areas by means of a covering mask 130, for example photolithographic, as shown in FIG. 28. This mask 130 thus has suitable first and second portions 130a and 130b of such sizes as to cover respectively the source 150 and drain 160 areas.

Advantageously, the third masking step also allows to cover, by means of a third portion 130c, the conductive organic polymer layer 111 suitable for realizing, simultaneously, suitable contact areas PAD.

Subsequently, a fourth step of irradiating, by means of UV radiation, the masked organic material layer 111 allows to deactivate the exposed portion of the organic material layer 111 and to define the channel area 155 as well as the source area 150 and the drain area 160 of the transistor OTFT and, simultaneously, to define the contact area PAD.

In particular, advantageously with respect to the prior art, the source area 150 and the drain area 160 and also the contact area PAD remain conductive portions of the mixture PANI/CSA 111, while the channel area 155 as well as the surrounding areas of the source area 150, of the drain area 160 and perimetrical portions 197 of the contact area PAD are made insulating, i.e., non-conductive, by means of the UV radiation.

Preferably, the fourth irradiation step provides to irradiate the mixture of conductive polyaniline PANI/CSA by using UV radiation with wavelength substantially equal to 250 nm.

Advantageously, the fourth step provides to expose the mixture of conductive polyaniline PANI/CSA, during the irradiation, to a nitrogen flux allowing to improve the reduction to the non-conductive form (leucoemeraldine base) of the non-masked conductive organic polymer layer 111.

Suitably, the method provides to remove through sublimation the photoinitiator still present in the source area 150, in the drain area 160 and in the contact area PAD. This removal can for example provide the heating of the organic material layer 111 at the temperature of 110° C.

Figure 29:
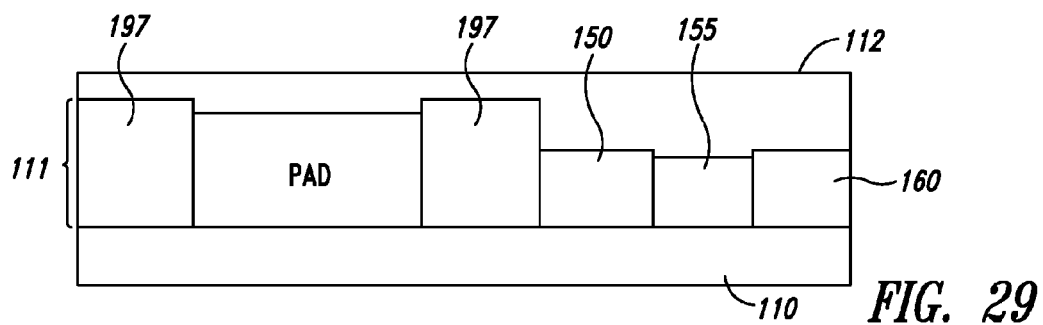

Advantageously, the morphologic analysis of the conductive polyaniline mixture PANI/CSA after the fourth irradiation step has highlighted a volume variation of the irradiated areas made non-conductive which is defined in a thickness variation of these portions equal to about 30% with respect to the thickness of the masked areas maintained conductive, as shown in particular in FIG. 29.

The difference of resistivity between the conductive portions and the portions made non-conductive is greater than $10^6$ Ω*cm (i.e., a difference of sheet resistance equal to $10^6$ Ω/square).

Advantageously, then, the channel area 155 and the perimetrical portions 197, as well as the areas not highlighted in the Figure but perimetrical to the source 150 and drain 160 areas, irradiated by the UV radiation, undergo a volume increase which is defined in a thickness increase.

Suitably, a regulation of the mold Mold11 allows the channel area 155 after the irradiation step to have a thickness equal to the thickness of the source area 150 and of the drain area 160. Advantageously, then, the method according to the present disclosure allows to avoid the filling, above the channel area 155, with another material. In order to identify the nature of the materials under examination, the spectroscopy IR-Raman has been used.

Figure 33:
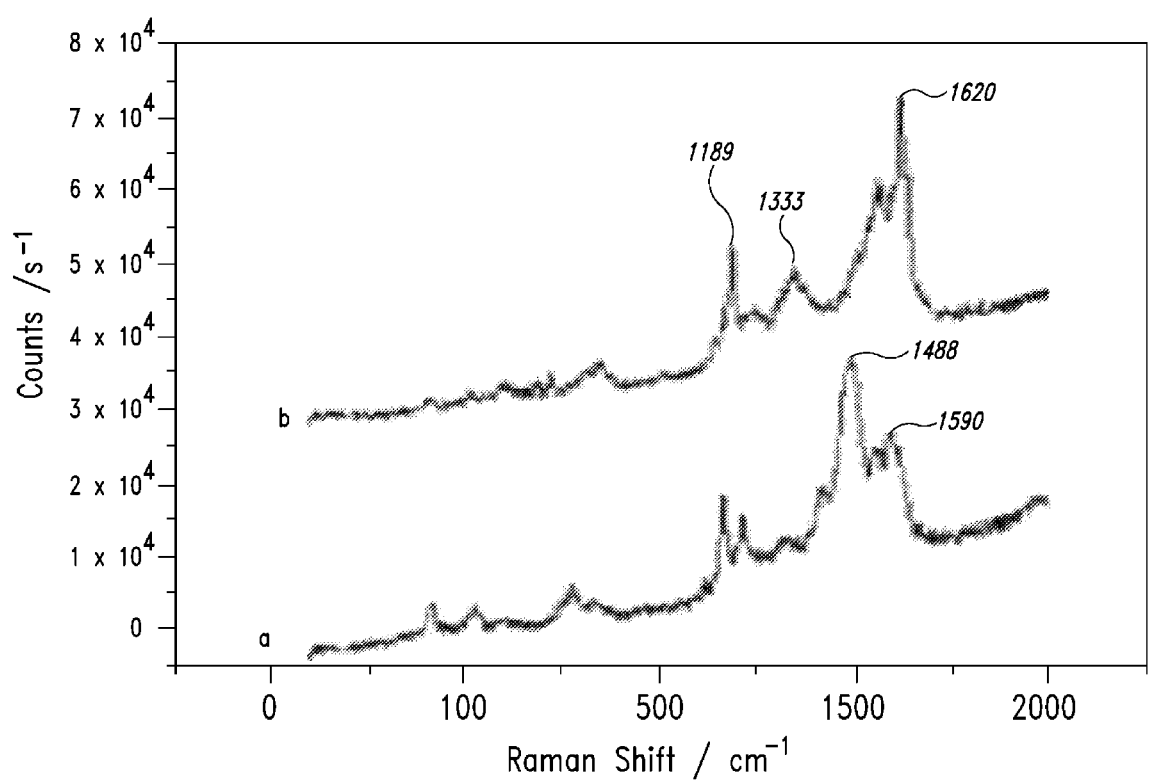
FIG. 33 shows the spectra IR-Raman of the polyaniline in the emeraldine base EB form and of the mixture PANI-CSA used in the present disclosure.

FIG. 33 reports the spectra IR-Raman of the powder of polyaniline in the emeraldine base EB form and of the mixture PANI-CSA of the organic material layer 111.

The comparison of the two spectra has allowed to verify, from a quality viewpoint, the effective protonation of the polyaniline in the base form.

As it is observed in this FIG. 33, the band observed at 1333 $cm^{-1}$ ($CN^-$+stretching) is the band characteristic of the cationic radical and the intensity increase of this band explains the conversion of the quinoidine ring characteristic of the emeraldine base, into benzene ring characteristic of the complexed emeraldine.

The bands at 1488 $cm^{-1}$ and 1590 $cm^{-1}$ assigned respectively to the stretching C=N and to the stretching C=C of the quinoidine ring, are not observed in the spectrum of the polyaniline PANI-CSA.

The spectrum of the polyaniline PANI-CSA has bands at 1620 $cm^{-1}$ and 1189 $cm^{-1}$ (C—C stretching and C—H bending) relative to the vibrational modes of the benzenic unit.

All these changes are consistent with the transformation of the units of the quinoidine type into units of the benzene type.

The method, according to the present disclosure, then comprises:
a fifth step of depositing above the substrate 110 a semiconductor layer 112, as shown in FIG. 29. Advantageously, the semiconductor substrate 112 is an organic material layer deposited by using a spin coating or inkjet printing procedure.

Then, the method provides:
a sixth step of etching the semiconductor layer 112 and the organic polymer layer 111, and in particular of the perimetrical portions 197, to realize a flat surface S of thickness substantially equal to the starting thickness T of the conductive organic polymer layer 111.

Figure 30:
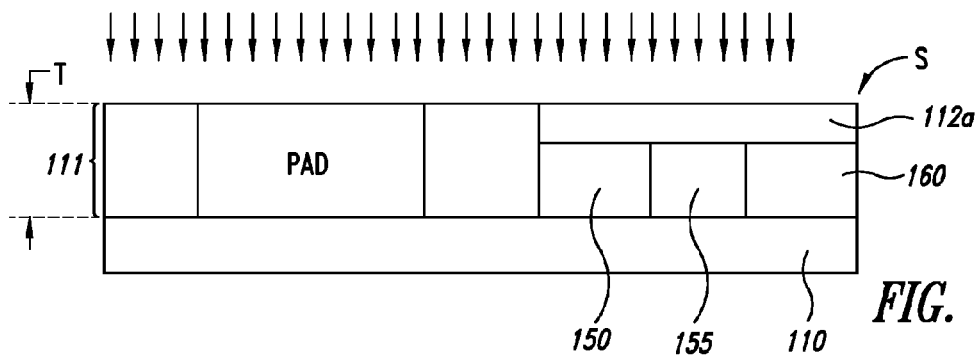

Advantageously, the sixth etching step defines a reduced semiconductor layer 112a which is reduced in thickness and which remains confined above the source area 150, the channel area 155 and the drain area 160, as shown in FIG. 30, i.e., in correspondence with the reduced portion 180.

Then, the reduced portion 180, realized during the second patterning step, operated as container of the reduced semiconductor layer 112a. Moreover, advantageously, this reduced portion 180 allows to separate the active area of the transistor OTFT 145, which is to be realized, from the contact area PAD or from further adjacent devices. In this way the problem is avoided of the crosstalk present during the realization of adjacent devices, obtained with a process according to the prior art.

Figure 32:
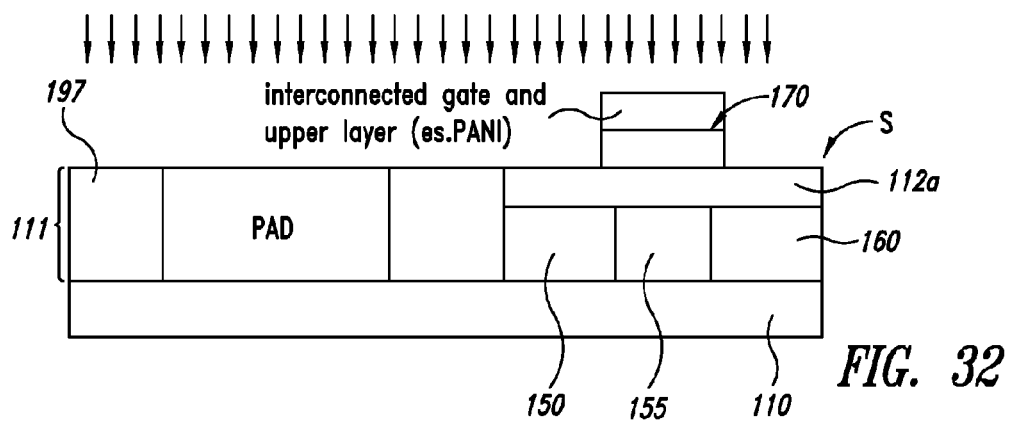

Finally, the method comprises:
a final step of realizing a gate area 170 of the transistor OTFT 145 as shown in FIG. 32.

Figure 31:
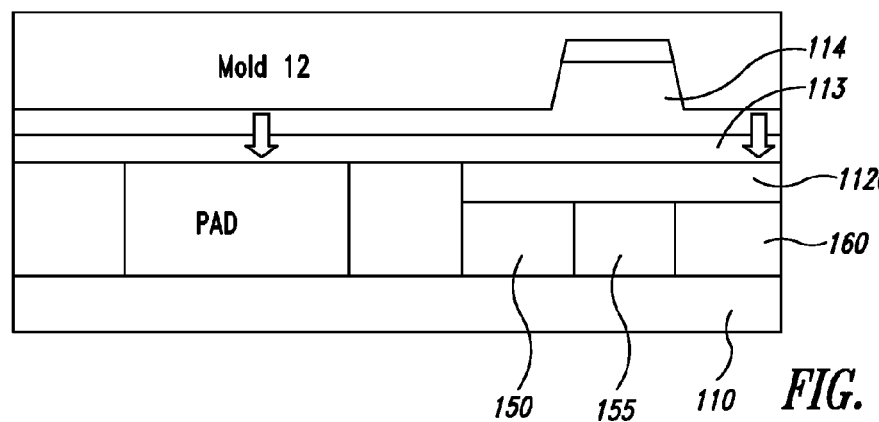

Suitably, according to the present embodiment, the final step also comprises:
a pre-step of depositing a further dielectric layer 113; and subsequently:

a first sub-step of depositing on the further dielectric layer 113 a further conductive organic polymer layer 114, in particular mixture of conductive polyaniline PANI/CSA;

a second etching sub-step by means of soft-lithographic procedure of the further layer 114 of mixture PANI/CSA and of the further dielectric layer 113 with a further mold Mold12 to realize the gate area 170, as shown in FIG. 31;

a third sub-step of etching by means of reactive ion etching or RIE procedure the further layer 114 of mixture PANI/CSA to define said gate area 170.

In particular, the pre-step and the first sub-step use a spin coating procedure for the deposition, respectively, of the further dielectric layer 113 and of the further layer 114 of mixture PANI/CSA.

Suitably, moreover, said second sub-step etches with lithographic Nano-imprinting or nanomold or NIL (Nano-imprinting Lithography) procedure the further layer of mixture PANI/CSA 114.

The method according to the present disclosure thus allows to obtain thin film organic electric devices by simplifying the process steps and using, in a singular way, the properties of the polyaniline doped and complexed in a mixture PANI/CSA and advantageously combining soft-lithographic techniques which allow to reduce the used material layers to obtain thin film electronic devices, i.e., with reduced thickness.

Moreover, advantageously, the method allows to realize transistors OTFT 145 and contact areas PAD simultaneously with an extremely reduced number of steps.

It is to be underlined how the third masking step of the method indicated could provide, alternatively with respect to the use of the covering mask 130, the use of a microcontact printing procedure which allows to "mask" the organic material layer 111 in correspondence with the source area 150 and with the drain area 160 depositing on these areas a material opaque against ultraviolet radiations UV. This material could be subsequently removed after the fourth irradiation step, while the device 100 is defined by means of the successive fifth and sixth step as well as final step as previously described.

Alternatively, it is to be underlined how the method described is suitable for realizing devices with a different layout according to defined design specifications and in particular comprising a suitable number of organic thin film transistors as well as further circuitry elements such as for example dummy lines and/or capacitors as well as further contact areas PAD in different mutual positions, with simple modifications of the steps indicated, all within the average technician's reach.

Moreover, alternatively with respect to the mixture of complexed conductive polyaniline, a different conductive organic polymer can be used, such as for example the Poly(3,4-ethylenedioxythiophene)-poly(styrenesulfonate) known with the acronym PEDOT/PSS.

Further, simple modifications to the method described allow to realize thin film organic electronic devices with common gate transistors OTFT by using a single conductive organic material layer for realizing and defining the source, drain and channel areas, according to what has been previously described. In this case, tone can suitably shape the mold Mold11 and adapt the successive steps of the method.

The present disclosure also relates to a thin film organic electric device realized by means of a method as previously described for which details and cooperating parts having the same structure and function will be indicated with the same reference numbers and acronyms.

Figure 25:
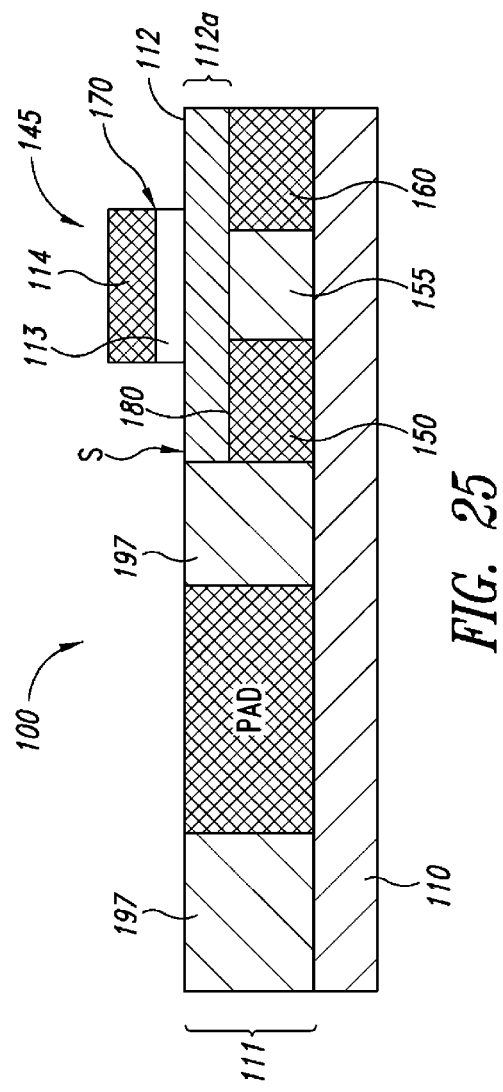
FIG. 25 shows an organic electronic device realized according to the present disclosure.
Figure 13:
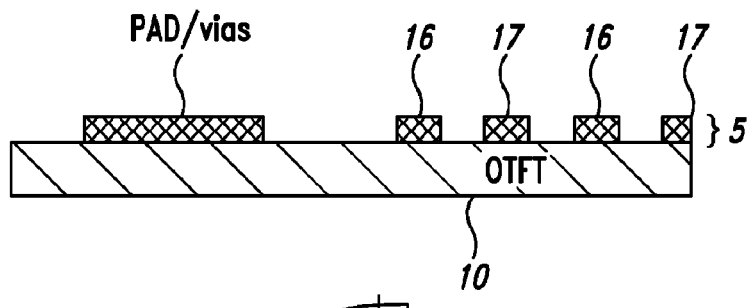
FIGS. 13 to 24 schematically show in sequence a method for the realization of the device of FIG. 12.
Figure 14:
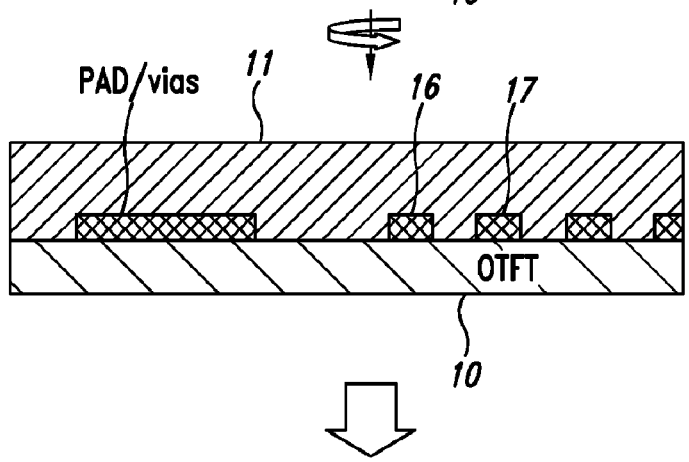
Figure 15:
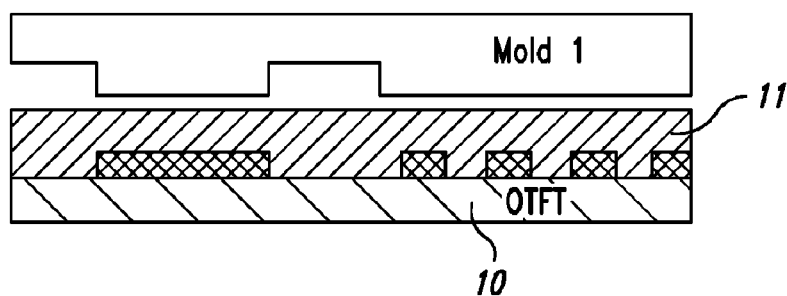
Figure 16:
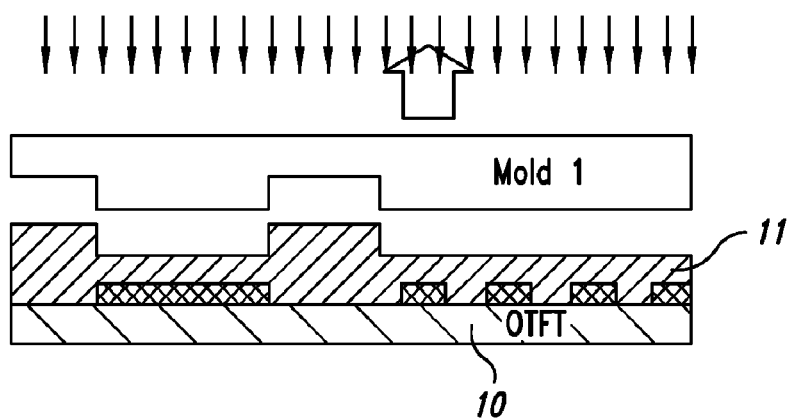
Figure 17:
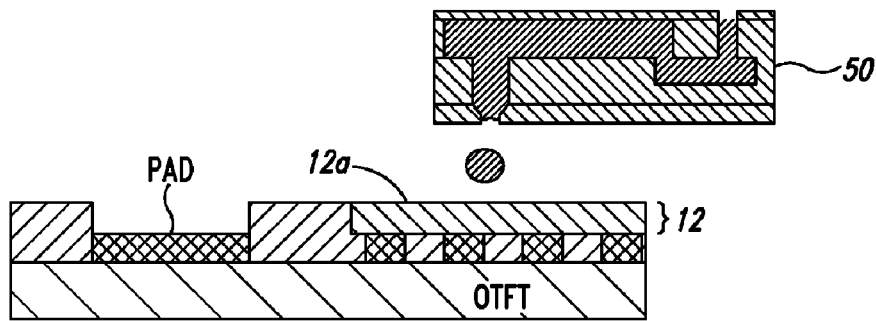
Figure 18:
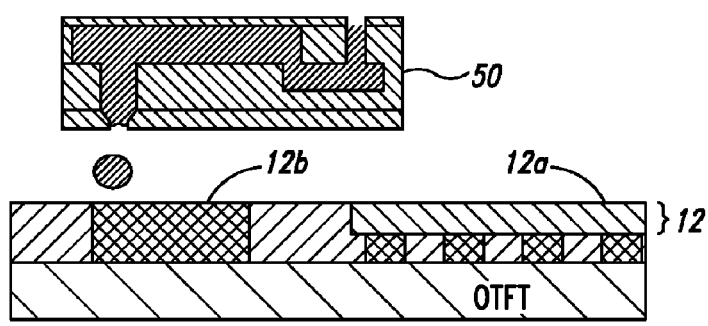
Figure 19:
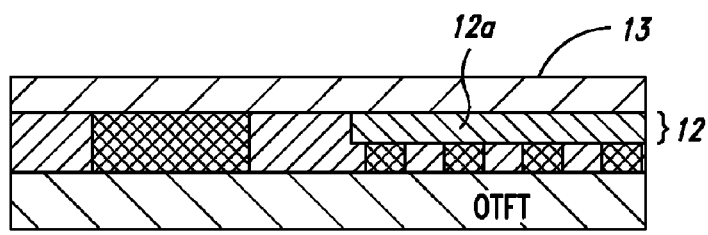
Figure 20:
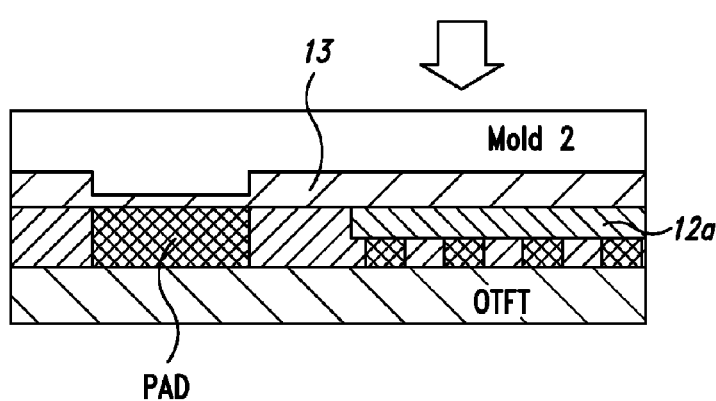
Figure 21:
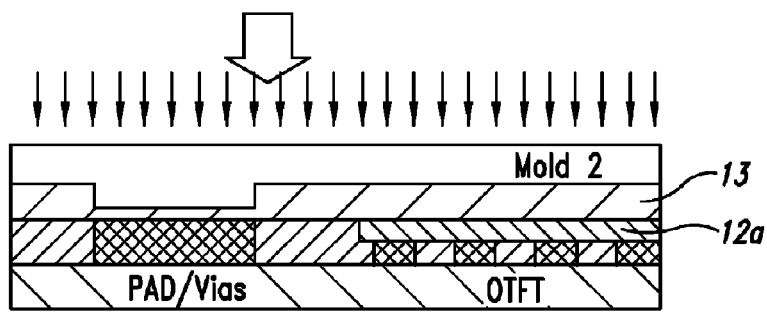
Figure 22:
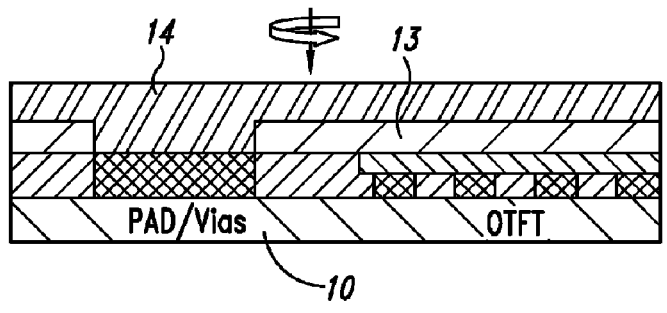
Figure 23:
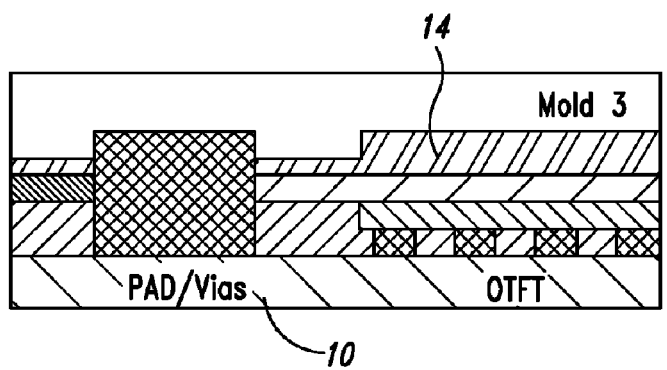
Figure 24:
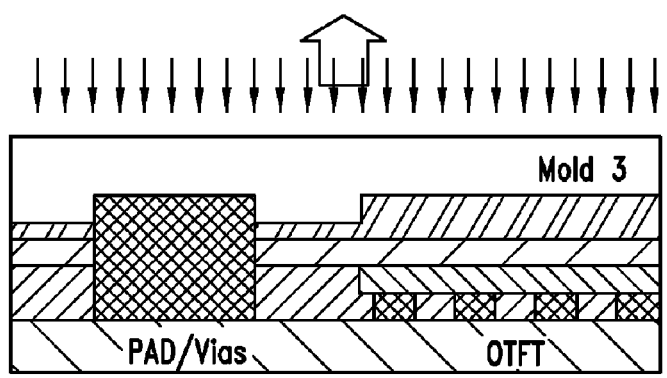

In particular, as shown for example in FIG. 25, the organic electric device 100 is integrated on a substrate 110 of plastic material or of glass, and comprises an organic transistor OTFT 145.

A source area 150, a drain area 160 and a channel area 155 of the transistor OTFT 145 are realized above the substrate 110 starting from a same conductive organic material layer 111.

Advantageously, the layer 111 is a conductive conjugate organic polymer, in particular a complexed conductive polyaniline mixture PANI/CSA.

The source area 150, the drain area 160 and the channel area 155 are realized in a reduced portion 180 of the conductive organic material layer 111, which is obtained with a soft-lithographic procedure. This procedure uses a mold Mold11 with a first protuberance 178, plate-like shaped, and a second protuberance 179, plate-like shaped, centrally projecting from the first protuberance 178, as shown in FIG. 26. In this way, the mold Mold11 allows to further reduce the thickness of the conductive organic polymer layer 111 in correspondence with the organic thin film transistor OTFT 145 to be realized.

In particular, the second protuberance 179 of the mold Mold11 realizes the channel area 155, with a thickness T2, while the first protuberance 178 realizes the source area 150 and the drain area 160, with a thickness T1. Even more in particular, the thickness T2 is lower than the thickness T1.

Advantageously, the channel area 155, as well as the source area 150 and the drain area 160 are defined by means of ultraviolet radiations UV. Substantially, only the channel area 155 is irradiated by the ultraviolet radiations UV while the source area 150 and the drain area 160 are suitably covered by means of a mask 130, shown in FIG. 28. The channel area 155 as well as all the areas of the conductive organic polymer layer 111 irradiated with ultraviolet radiations UV undergo a thickness increase, which is substantially equal to 30% of a starting thickness.

Advantageously, then, the channel area 155 has a final thickness which substantially corresponds to the thickness of the source area 150 and of the drain area 160. Thanks to the thickness increase of the conductive polyaniline PANI/CSA layer, due to the ultraviolet radiation UV in combination with the definition of the reduced portion 180 realized by means of the mold Mold11 suitably sized, the use of further filling materials is avoided.

In fact, according to the present embodiment, the transistor OTFT 145 comprises a gate or control area 170 realized above the channel area 155 by means of the interposition of a single semiconductor layer 112. The semiconductor layer 112, advantageously, can be an organic material layer deposited by spin-coating or inkjet printing procedure and suitably reduced in thickness to realize a reduced semiconductor layer 112a.

Preferably, the gate area 170 of the transistor OTFT 145 comprises a further dielectric layer 113 and, in particular, of dielectric organic material, interposed between a further upper conductive organic polymer layer 114 and the underlying semiconductor organic material layer 112.

Advantageously, the organic device 100 also comprises at least one contact area PAD suitable for allowing the external connection by means of contact electrodes with supply voltages and/or data transfer circuits.

The contact area PAD is a portion of the complexed conductive polyaniline PANI/CSA mixture which defines the conductive organic polymer layer 111 and is preferably obtained simultaneously with the transistor OTFT 145.

Thus, the contact area PAD is defined by means of UV radiation with the use of the same covering mask 130, shaped so as to cover this area and making respective perimetrical portions 197 of the contact area PAD insulating, i.e., non-conductive. The perimetrical portions 197 undergo further to the UV radiation a thickness increase and are subsequently reduced by means of a suitable etching step RIE.

Advantageously, in this case, the contact area PAD is defined simultaneously with the source area 150 and with the drain area 160 by means of a single irradiation step and by using a single mask 130.

One advantage of the method is the small amount of materials used and the small number of steps necessary for realizing the thin film organic device which also allow to reduce the lateral sizes of the transistor obtained. This advantage is linked to the combination of the use of the conductive PANI/CSA mixture, deposited as layer and subsequently reduced to thin film, with soft-lithographic procedure as well as to the possibility of defining non-conductive areas on a lowered portion by means of a simple ultraviolet radiation UV with a suitable mask.

Another great advantage is given by the presence of a single material, i.e., the mixture of complexed conductive polyaniline PANI/CSA for realizing insulating areas and conductive areas.

A further great advantage is given by the reliability of the device obtained given by the possibility of defining insulating areas with a remarkable accuracy, simplifying the method steps. In particular, the method allows to realize a device with a total absence of interface areas between the conductive and insulating areas during the method steps avoiding damages or degradation effects of the other employed materials layers.

Another advantage is that of showing a remarkable time as well as economic saving due to the reduced number of steps defining the method, with respect to a conventional method as well as to the reduced number of materials employed.

Another remarkable advantage, thanks to the use of a single conductive polyaniline layer patterned by means of UV radiations to realize active areas and insulating areas of the transistor OTFT, is given by the reduction of the parasite capacitances which are formed with respect to the transistors realized according to the prior art. This allows, in a surprising way, to increase the performances of the transistor OTFT obtained with respect to similar prior art transistors.

Another advantage of the method is given by the reliability of the same and by the possibility of using in a repeated way a same mold for the soft-lithographic steps of the thin film ensuring a good reproducibility of the method.

Another remarkable advantage is given by the possibility of realizing with same steps and employing a small number of layers, transistors OTFT with thin film and contact areas PAD.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
realizing a thin film organic electronic device, the realizing including:
depositing an organic material layer on a substrate, said organic material layer being a conductive organic polymer;
making a channel area of an organic thin film transistor (OTFT) by patterning by a soft-lithographic procedure said organic material layer to create a reduced portion;
masking said organic material layer by covering with a cover mask a source area and a drain area of said OTFT;
deactivating exposed portions of said organic material layer defining said source area, said drain area and said channel area by irradiating by ultraviolet radiation, said channel area growing in volume;
depositing a semiconductor layer on said organic material layer; and
creating on said semiconductor layer a gate area of said OTFT.

2. A method according to claim 1 wherein depositing the organic material layer includes creating said organic material layer using a mixture of conductive Polianiline.

3. A method according to claim 2 wherein depositing the organic material layer includes creating said organic material layer using a mixture of complexed conductive Polianiline.

4. A method according to claim 3 wherein said mixture of complexed conductive Polianiline includes a photo-initiator activated by the ultraviolet radiation.

5. A method according to claim 4 wherein depositing the organic material layer includes depositing said organic material layer by a spin-coating procedure and annealing said organic material layer.

6. A method according to claim 5 wherein masking said organic material layer includes using as the cover mask a photolithographic mask.

7. A method according to claim 6 wherein the irradiating occurs under a nitrogen flux and said photo-initiator is subsequently removed by sublimation.

8. A method according to claim 1, wherein masking said organic material layer includes using a micro-contact printing procedure.

9. A method according to claim 1, wherein:
making the channel area of the OTFT includes creating the reduced portion using a nano-imprinting lithography procedure using a mold which comprises a shaped protuberance.

10. A method according to claim 9, wherein said mold includes a first protuberance and a second protuberance that extends from said first protuberance, said first protuberance creating said source area and said drain area and said second protuberance creating said channel area of smaller thickness than said source area and said drain area.

11. A method according to claim 1, wherein the semiconductor layer is an organic material layer deposited by a spin-coating procedure.

12. A method according to claim 1, wherein masking said organic material layer includes covering by said cover mask a contact area in said organic material layer, and deactivating the exposed portions includes deactivating perimetrical portions of said contact area to define said contact area, said perimetrical portions having a growth of thickness.

13. A method according to claim 12, comprising etching said semiconductor layer and said organic material layer, the etching including creating a flat superior surface defining a reduced semiconductor layer confined on said source area, said channel area and said drain area.

14. A method according to claim 13, wherein creating on said semiconductor layer the gate area of said OTFT comprises:
- depositing a further layer of conductive organic material over said reduced semiconductor layer;
- etching by a soft-lithography procedure said further layer of conductive organic material using a further mold in order to create said gate area;
- etching by a reactive ion etching procedure said further layer of conductive organic material for defining said gate area.

15. A method according to claim 14, comprising, before creating on said semiconductor layer the gate area of said OTFT, depositing a further dielectric layer on said reduced semiconductor layer.

16. A method according to claim 15, wherein depositing the further layer of conductive organic material and depositing the further dielectric layer use a spin-coating procedure.

17. A method according to claim 14, wherein etching said further layer of conductive organic material includes using a Nano-Imprinting Lithography procedure.

18. A method according to claim 1, wherein depositing a further layer of conductive organic material includes depositing a layer of complexed conductive Polianiline.

19. A method, comprising:
- forming an organic thin film transistor (OTFT), the forming including:
- forming an organic material layer on a substrate, said organic material layer being a conductive organic polymer;
- forming a reduced portion of the organic material layer by a soft-lithographic procedure, the reduced portion being a channel area of the OTFT;
- masking said organic material layer by covering with a cover mask a source area and a drain area of the organic material layer;
- growing the channel area in volume by UV irradiating the channel area through an opening in the cover mask;
- forming a semiconductor layer on the channel area of said organic material layer;
- forming a dielectric layer on the semiconductor layer; and
- forming a gate on the dielectric layer.

20. A method according to claim 19 wherein forming the organic material layer includes forming said organic material layer using a mixture of complexed conductive Polianiline that includes a photo-initiator that is activated by the UV irradiating.

21. A method according to claim 20 wherein the irradiating occurs under a nitrogen flux and said photo-initiator is subsequently removed by sublimation.

22. A method of making an organic thin film electronic device, comprising:
- forming an organic thin film transistor having a source area, a drain area, and a channel area between the source and drain areas, forming the organic thin film transistor including:
- forming an organic material layer, said organic material layer being a conductive organic polymer;
- defining the source, drain, and channel areas in said organic material layer by a soft-lithography procedure; and
- irradiating, after defining the channel area by the soft-lithography procedure, said channel area with UV radiation, the irradiating including expanding a thickness of the channel area and making the channel area non-conductive.

23. A method according to claim 22, further comprising:
forming a semiconductor layer on the channel area of said organic material layer;
forming a dielectric layer on the semiconductor layer; and
forming a conductive gate on the dielectric layer.

24. A method according to claim 23, wherein:
the semiconductor layer is an organic material semiconductor layer and is formed on said source area, said channel area, and said drain area; and
the conductive gate is conductive organic material layer.

25. A method according to claim 22, wherein:
forming the organic material layer includes forming said organic material layer using a mixture that includes a complexed conductive polymer and a photo-initiator; and
irradiating said channel area with UV radiation includes activating the photo-initiator with the UV radiation.

26. A method according to claim 25, comprising removing said photo-initiator by sublimation after the irradiating.

* * * * *